United States Patent
Matsushita et al.

(10) Patent No.: US 9,888,528 B2
(45) Date of Patent: Feb. 6, 2018

(54) SUBSTRATE SUPPORT WITH MULTIPLE HEATING ZONES

(71) Applicant: APPLIED MATERIALS, INC., Santa Clara, CA (US)

(72) Inventors: Tomoharu Matsushita, Chiba (JP); Jallepally Ravi, San Ramon, CA (US); Cheng-Hsiung Tsai, Cupertino, CA (US); Aravind Kamath, Santa Clara, CA (US); Xiaoxiong Yuan, San Jose, CA (US); Manjunatha Koppa, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 224 days.

(21) Appl. No.: 14/634,711

(22) Filed: Feb. 27, 2015

(65) Prior Publication Data
US 2016/0192444 A1    Jun. 30, 2016

Related U.S. Application Data

(60) Provisional application No. 62/098,887, filed on Dec. 31, 2014.

(51) Int. Cl.
*H05B 3/26* (2006.01)
*H01L 21/67* (2006.01)

(52) U.S. Cl.
CPC ......... *H05B 3/26* (2013.01); *H01L 21/67103* (2013.01); *H05B 2203/037* (2013.01)

(58) Field of Classification Search
CPC .......... H05B 3/26; H05B 3/68; H05B 1/0295; H01L 21/67103; H01L 21/683; C23C 16/458
See application file for complete search history.

(56) References Cited

U.S. PATENT DOCUMENTS

| | | | | |
|---|---|---|---|---|
| 5,128,515 A | * | 7/1992 | Tanaka | C23C 16/4411 |
| | | | | 118/725 |
| 6,001,183 A | * | 12/1999 | Gurary | C23C 16/4584 |
| | | | | 118/720 |
| 2003/0062359 A1 | * | 4/2003 | Ho | H01L 21/67103 |
| | | | | 219/444.1 |
| 2004/0035530 A1 | | 2/2004 | Ilzuka | |
| 2009/0274590 A1 | | 11/2009 | Willwerth et al. | |
| 2010/0163188 A1 | | 7/2010 | Tanaka et al. | |
| 2011/0147363 A1 | * | 6/2011 | Yap | H01L 21/68792 |
| | | | | 219/385 |
| 2012/0285619 A1 | | 11/2012 | Matyushkin et al. | |
| 2014/0197151 A1 | | 7/2014 | Volfovski et al. | |
| 2015/0170952 A1 | | 6/2015 | Subramani et al. | |

OTHER PUBLICATIONS

International Search Report and Written Opinion dated Jan. 25, 2016 for PCT Application No. PCT/US2015/056934.

* cited by examiner

*Primary Examiner* — Brian Jennison
(74) *Attorney, Agent, or Firm* — Moser Taboada; Alan Taboada

(57) ABSTRACT

Embodiments of substrate supports are provided herein. In some embodiments, a substrate support may include a body having a support surface; and a first heater disposed within the body and having a first heating coil and multiple heating zones, wherein a pitch of windings of the first heating coil vary among each of the multiple heating zones to define a predetermined heating ratio between the multiple heating zones.

16 Claims, 5 Drawing Sheets

SUBSTRATE SUPPORT WITH MULTIPLE HEATING ZONES

CROSS-REFERENCE TO RELATED APPLICATIONS

This application claims benefit of U.S. provisional patent application Ser. No. 62/098,887, filed Dec. 31, 2014, which is herein incorporated by reference in its entirety.

FIELD

Embodiments of the present disclosure generally relate to semiconductor processing equipment.

BACKGROUND

The inventors have observed that many conventional substrate support heaters in chemical vapor deposition (CVD) and atomic layer deposition (ALD) chambers exhibit high heat loss when operated at high temperatures (e.g., greater than about 350° C.) due to radiation at the bottom and side surfaces of the substrate support and support shaft. The inventors have further observed that the heat loss results in non-uniform processing of a substrate disposed on the substrate support.

Therefore, the inventors have provided embodiments of substrate supports having more uniform heating.

SUMMARY

Embodiments of substrate supports are provided herein. In some embodiments, a substrate support may include a body having a support surface; and a first heater disposed within the body and having a first heating coil and multiple heating zones, wherein a pitch of windings of the first heating coil vary among each of the multiple heating zones to define a predetermined heating ratio between the multiple heating zones.

In some embodiments, a process chamber may include a chamber body defining an inner volume; and a substrate support disposed in the inner volume. The substrate support may include a body having a support surface; and a first heater disposed within the body and having a first heating coil and multiple heating zones, wherein a pitch of windings of the first heating coil vary among each of the multiple heating zones to define a predetermined heating ratio between the multiple heating zones.

In some embodiments, a substrate support may include a body having a support surface; a first heater disposed within the body and having a first heating coil and multiple heating zones; and a second heater having a second heating coil, wherein the second heater is disposed outside of a diameter of a substrate to be processed wherein a pitch of windings of the first heating coil varies among each of the multiple heating zones to define a predetermined heating ratio between the multiple heating zones, and wherein the multiple heating zones includes a first heating zone, a second heating zone, and a third heating zone.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
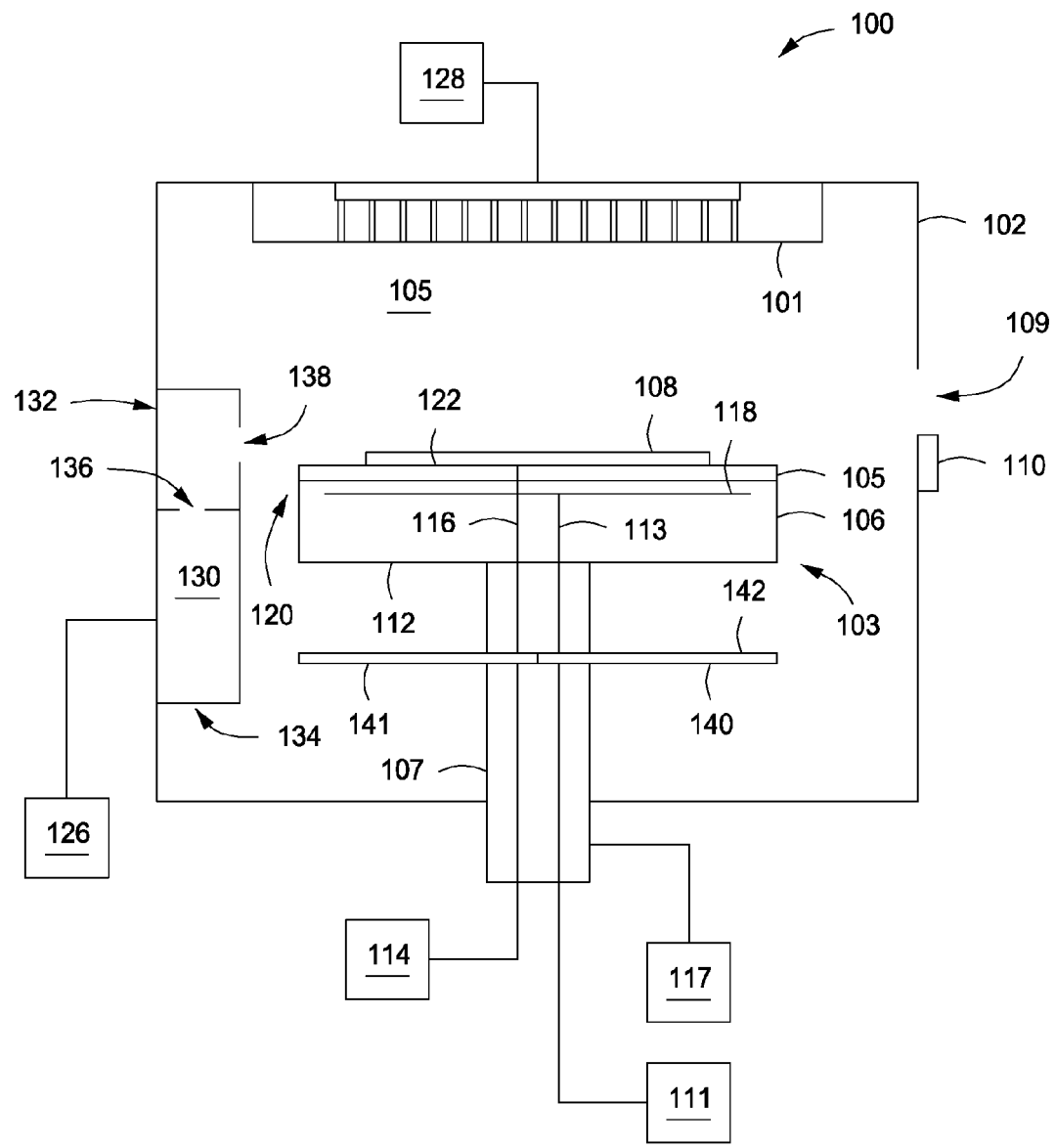
FIG. 1 depicts a schematic view of a process chamber suitable for use with a substrate support in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports that provide improved heating are provided herein. Embodiments of the inventive substrate support advantageously provide more uniform heating of a substrate being processed, thus improving processing uniformity (for example, uniformity of a deposited film in a deposition process). While not intending to be limiting of the scope of the disclosure, the inventive substrate support disclosed herein may be particularly advantageous in process chambers configured for chemical vapor deposition (CVD), optionally having radio frequency (RF) capability, for example such as CVD process chambers suitable to process 200, 300, or 450 mm diameter substrates, substrates having other geometries (such as rectangular), or the like.

FIG. 1 depicts a process chamber 100 suitable for use with a substrate support having a heater in accordance with some embodiments of the present disclosure. The process chamber 100 may be any process chamber suitable for performing one or more substrate processes, for example, deposition process such as chemical vapor deposition (CVD), physical vapor deposition (PVD), atomic layer deposition (ALD) or the like. In some embodiments, the process chamber is a CVD process chamber. The process chamber may be a standalone process chamber or a part of a cluster tool, such as one of the CENTURA®, PRODUCER®, or ENDURA® cluster tools available from Applied Materials, Inc. of Santa Clara, Calif.

In some embodiments, the process chamber 100 may generally include a chamber body 102, a substrate support 103 for supporting a substrate 104 and one or more gas inlets (e.g., showerhead 101) for providing one or more processes gases to an inner volume 119 of the chamber body 102.

In some embodiments, the chamber body 102 may comprise one or more openings (one opening 109 shown) to allow for the substrate 104 to be provided to, and removed from, the process chamber 100. The opening 109 may be selectively sealed via a slit valve 110, or other mechanism for selectively providing access to the inner volume 119 of the chamber body 102 through the opening 109. In some embodiments, the substrate support 103 may be coupled to a lift mechanism 117 that may control the position of the substrate support 103 between a lower position (as shown) suitable for transferring substrates into and out of the chamber via the opening 109 and a selectable upper position suitable for processing. The process position may be selected to maximize process uniformity for a particular process. When in at least one of the elevated processing positions, the substrate support 103 may be disposed above the opening 109 to provide a symmetrical processing region.

The one or more gas inlets (e.g., showerhead 101) may be coupled to a first gas source 128 for providing one or more process gases for carrying out processes in the process chamber 100. Although a showerhead 101 is shown, additional or alternative gas inlets may be provided such as nozzles or inlets disposed in the ceiling or on the sidewalls of the process chamber 100 or at other locations suitable for providing gases to the process chamber 100, such as the base of the chamber body 102, the periphery of the substrate support 103, or the like.

In some embodiments, the process chamber 100 further includes an exhaust 130 coupled to a pump 126 for removing process gases, purge gases, processing byproducts, and the like from the process chamber 100, for example, via one or more openings 138 fluidly coupling the inner volume 119 of the chamber body 102 with the exhaust 130. In some embodiments, the exhaust 130 may be disposed about the walls of the chamber body 102 and may further be split into an upper exhaust 132 and a lower exhaust 134 with one or more openings 136 disposed between the upper and lower exhaust 132, 134 to control the flow of the process gases, etc., through the exhaust 130 and to the pump 126 (e.g., to provide more azimuthally uniform flow from the processing region of the process chamber above the substrate to the exhaust 130 due to the asymmetric pump configuration).

The substrate support 103 generally comprises a body 120 having a first plate 105 to support a substrate 108 on a support surface 122 and a second plate 106 (heater plate) configured to support the first plate 105. A support shaft 107 supports the second plate 106. The substrate support 103 includes one or more heating elements arranged in a plurality of heating zones. In some embodiments, one or more heating elements 118 may be embedded within or recessed within the second plate 106, thus allowing the second plate 106 to function as a heater. A power source 111 provides power to the one or more heating elements 118 via a conduit 113 disposed within the support shaft 107. In some embodiments, the heating elements 118 may be embedded or recessed within the second plate 106 and may be configured such that multiple heating zones are provided across the second plate 106.

In some embodiments, a reflective heat shield 140 may be coupled to the support shaft 107 below the substrate support 103. The reflective heat shield 140 may be formed of a reflective metal such as, for example, aluminum to advantageously reflect any heat radiated from a bottom surface 112 of the body 120 back towards the body 120. In some embodiments, the reflective heat shield 140 may include a first section 141 and a second section 142 coupled to each other using any conventional fixation device (e.g., a screw). In order to facilitate correct placement of the reflective heat shield 140, the support shaft 107 may include a slot 506 (shown in FIG. 5) into which the first and second sections 141, 142 are inserted before being coupled to one another.

In some embodiments, a purge gas (e.g., an inert gas, such as argon), may be provided by a second gas source 114 to a backside of the substrate 104 via a conduit 116. In some embodiments, the conduit 116 is disposed in a sidewall or within a central opening of the support shaft 107. One or more conduits (described below) are provided to deliver the purge gas proximate the edge of the substrate 104.

Figure 2:
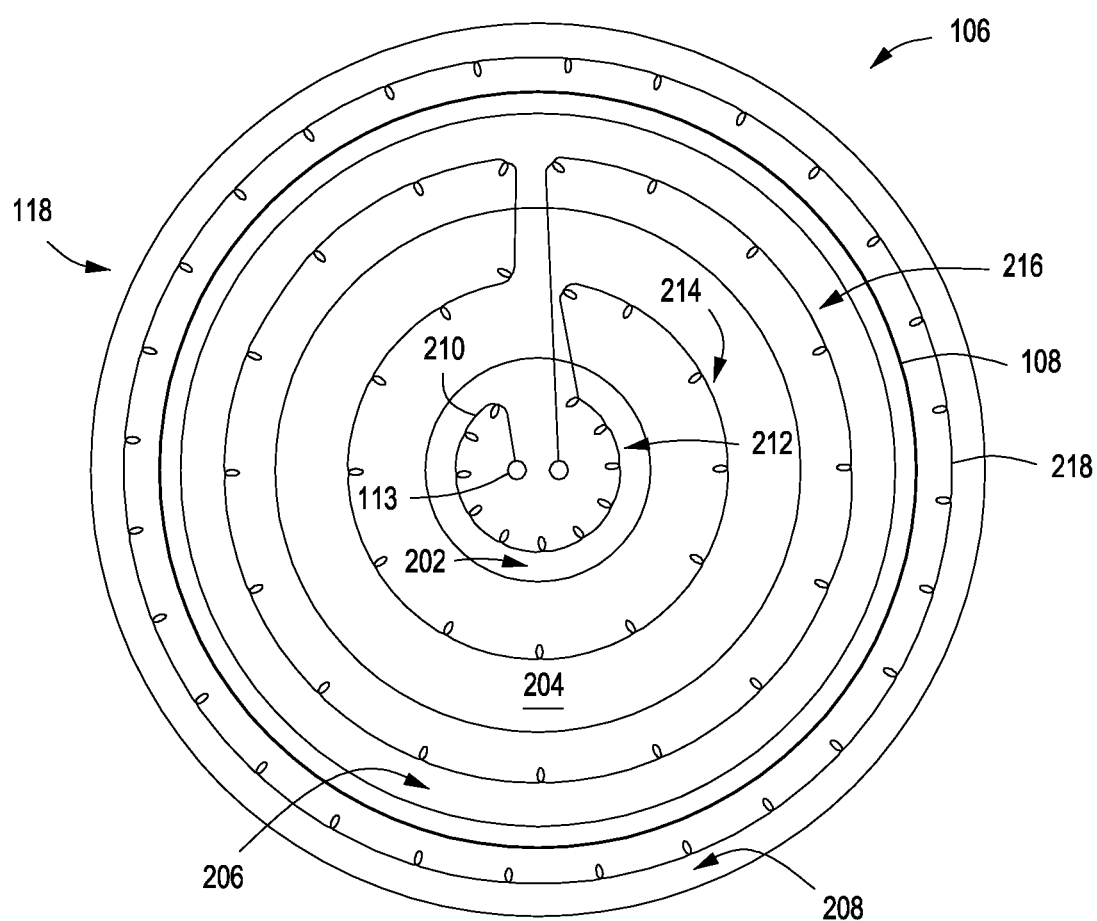
FIG. 2 depicts a schematic top view of a portion of a substrate support in accordance with some embodiments of the present disclosure.

FIG. 2 depicts a schematic view of the second plate 106 of the body 120. In some embodiments, the one or more heating elements 118 include a first heater 210 and a second heater 218. In some embodiments, the first and second heaters 210, 218 may be heating coils (e.g., resistive heating coils). In some embodiments, the first heater 210 may be an inner heater having a plurality of heating zones. For example, in some embodiments, the plurality of heating zones may include a first heating zone 202, a second heating zone 204, and a third heating zone 206.

In some embodiments, the plurality of heating zones are provided in a fixed predetermined ratio. In some embodiments, the plurality of heating zones are provided within a single conductor, or heating coil, by varying the pitch of the windings of the heating coil in the respective zones. For example, a first heating zone may have a first pitch of windings of the heating coil and a second heating zone may have a second pitch of windings of the heating coil, wherein the second pitch is different than the first pitch. Additional zones may be provided with respective winding pitches that may be the same or different than the first pitch or the second pitch to provide a predetermined heating ratio between the respective zones. The inventors have discovered that by varying a pitch of windings of the first heater 210 in each of the plurality of zones, a predetermined heating ratio between the zones can advantageously be achieved, thus controlling the temperature profile across the substrate 108.

In some embodiments, for example, a first pitch of windings 212 within the first heating zone 202 is greater than a second pitch of windings 214 within the second heating zone 204, and the second pitch of windings 214 within the second heating zone 204 is greater than a third pitch of windings 216 within the third heating zone 206. In some embodiments, the predetermined heating ratio of the first heating zone 202, the second heating zone 204, and the third heating zone 206 may be about 1 to about 0.4 to about 0.3 (e.g., about 1:0.4:0.3). Although the above description has been made with respect to three heating zones, any number of heating zones having a ratio of coil windings defining a predetermined heating ratio may be utilized to achieve a predetermined temperature profile across the substrate.

In some embodiments, the second heater 218 may be an outer heater disposed in an outer heating zone 208. In some embodiments, the outer heating zone is disposed in an area of the second plate 106 that is outside of a diameter of the substrate 108. For example, if the process chamber 100 is used to process 300 mm substrates, the second heater 218 may be disposed outside of the 300 mm diameter of the substrate. The inventors have discovered that disposing the second heater 218 outside of the diameter of the substrate 108 advantageously mitigates the heat loss from the side of the substrate support while minimizing any negative impact on the substrate. In some embodiments, a ratio of a pitch of windings of the second heater 218 to the first pitch of windings 212 may be about 0.5 to about 1 (e.g., about 0.5:1). As with the first heater 210, the second heater 218 may have any pitch of coil windings suitable to achieve a predetermined temperature profile across the substrate 108.

Figure 3:
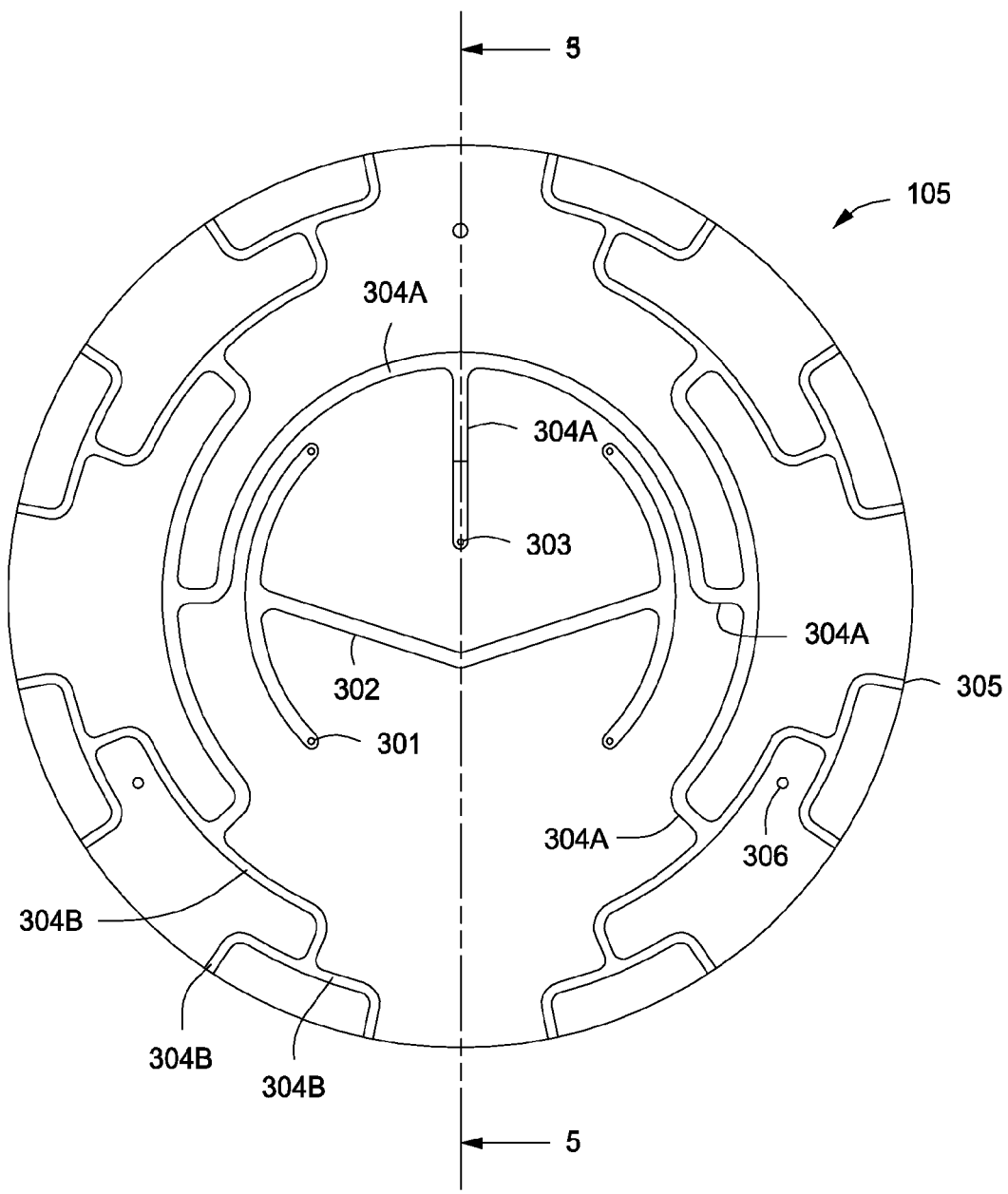
FIG. 3 depicts a backside view of a portion of a substrate support in accordance with some embodiments of the present disclosure.

FIG. 3 depicts a backside of the first plate 105 in accordance with some embodiments of the present disclosure. The inventors have discovered that the asymmetrical flow of purge gas around the substrate in conventional substrate supports results in an asymmetrical pattern of cooled areas along an edge of the substrate. As such, the inventors have implemented a purge gas channel pattern that is axissymmetrical and advantageously contributes to more uniform heating of the substrate 108. In some embodiments, the first plate 105 may advantageously provide more uniform distribution of the purge gases exiting the periphery of the first plate 105, as compared to conventional substrate supports. As shown in FIG. 3, a plurality of purge gas channels 304A, 304B may spread from a single inlet 303 in a central portion of the first plate 105 to a plurality of outlets 305 at the periphery of the first plate 105. In some embodiments, the purge gas channels 304A, 304B may spread recursively to the plurality of outlets 305 via a plurality of passages.

In some embodiments, the plurality of purge gas channels may have a substantially equal flow conductance. As used herein, the term substantially equivalent, or substantially equal, means within about 10 percent of each other. The terms substantially equivalent or substantially equal, as defined above, may be used to describe other aspects of the disclosure, such as conduit (or channel) length, flow length, cross-sectional area, flow rate, or the like.

In some embodiments, the plurality of purge gas channels may have a substantially equal flow length. In some embodiments, the plurality of purge gas channels may have a substantially equal cross-sectional area along an equivalent position along the respective purge gas channels (e.g., the cross-sectional area may vary along the length of each passage, but each channel in the plurality of purge gas channels will vary in a substantially equivalent manner). In some embodiments, the plurality of purge gas channels may be symmetrically arranged about the first plate 105. In some embodiments, a first cross-sectional area of each of the plurality of purge gas channels 304A is larger than a second cross-sectional area of each of the plurality of purge gas channels 304B. As a result of the reduced cross-sectional area proximate the periphery of the first plate 105, a choked flow condition is created. Thus, purge gas exits from all of the outlets 305 at a substantially equivalent flow rate.

For example, in some embodiments, the single inlet 303 is provided proximate a center of the top plate in order to be aligned with the conduit 116 in the support shaft 107. From the single inlet 303, the plurality of purge gas channels alternately extend radially outwardly and along an arc of a radius having a common center with the top plate (and substrate support in general). Each time a purge gas channel extends radially outwardly, the purge gas channel intersects the middle of an arc until the last radially outwardly extending channels exit the first plate 105.

As shown in FIG. 3, vacuum grooves 302 are also machined into the first plate 105. Openings 301 extend through the first plate 105 to fluidly couple the vacuum grooves 302 with a plurality of vacuum channels (402 in FIG. 4) on top of the first plate 105. A vacuum chucking supply (not shown) communicates with the vacuum grooves 302 to chuck a substrate 108 when placed atop the first plate 105. The first plate 105 may also include a plurality of lift pin holes 306 to allow lift pins (not shown) to pass through the first plate 105 and raise/lower the substrate 108 off/onto the first plate 105.

Figure 4:
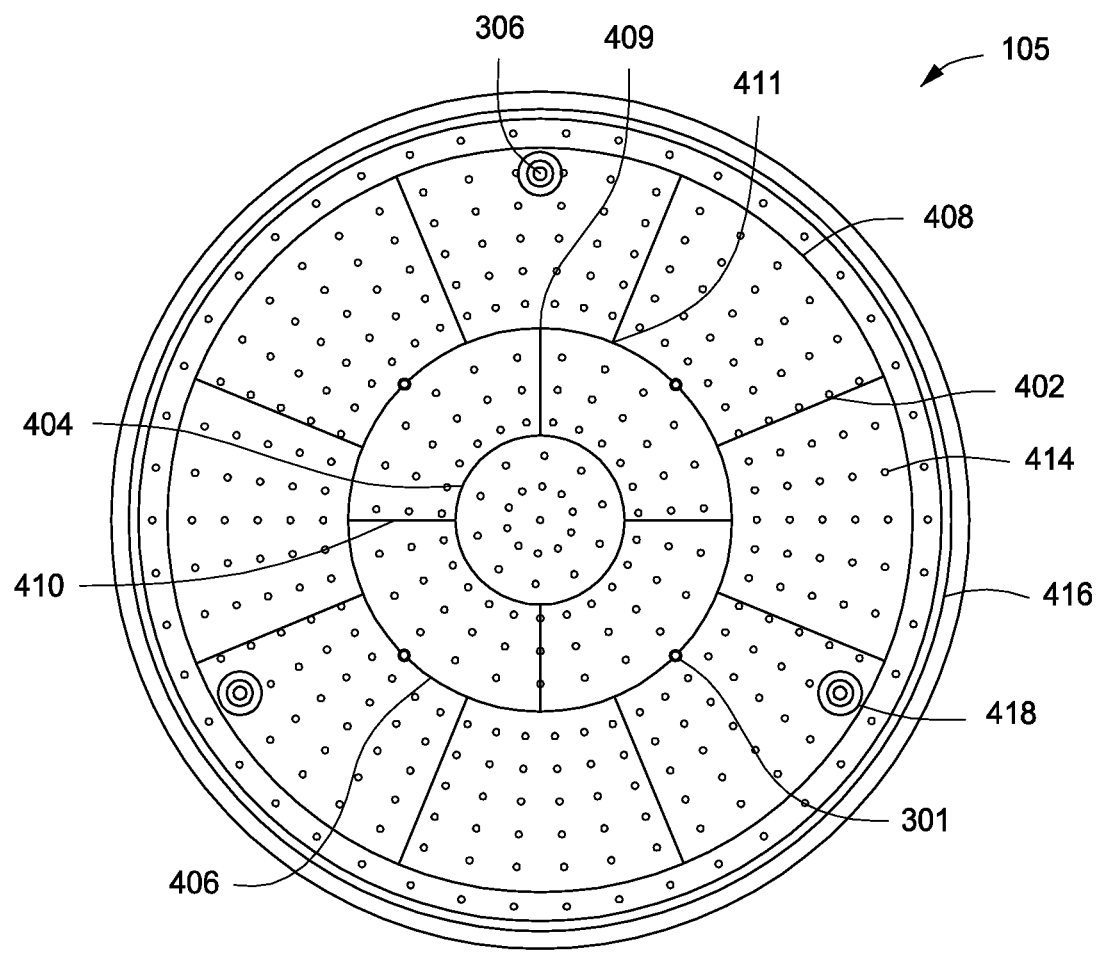
FIG. 4 depicts a top view of a substrate support in accordance with some embodiments of the present disclosure.

FIG. 4 depicts a top view of the first plate 105 in accordance with some embodiments of the present disclosure. The inventors have discovered that the asymmetrical pattern of vacuum channels extending from a single off-centered opening in conventional substrate supports results in non-uniform heating of the substrate. As such, the inventors have implemented an axissymmetrical pattern of vacuum channels 402 extending from a plurality of axissymmetrical openings 301 that advantageously result in a more uniform heating of the substrate 108.

In some embodiments, the plurality of vacuum channels 402 includes a first circular vacuum channel 404, a second circular vacuum channel 406, and a third circular vacuum channel 408 that are concentric to one another. A first plurality of radial channels 410 extends between the first and second circular vacuum channels 404, 406. A second plurality of radial channels 412 extends between the second and third circular vacuum channels 406, 408. The first plurality of radial channels 410 intersects the second circular vacuum channel 406 at a first plurality of intersection points 409. The second plurality of radial channels 412 intersects the second circular vacuum channel 406 at a second plurality of intersection points 411 different than the first plurality of intersection points 409. In some embodiments, the openings 301 are disposed in the first circular vacuum channel 404.

In some embodiments, the first plate 105 also includes a plurality of contact elements 414, an edge seal band 416, and a plurality of lift pin seal bands 418 corresponding to the plurality of lift pin holes 306. The plurality of contact elements 414, the edge seal band 416, and the plurality of lift pin seal bands 418 support a backside of the substrate 108. In some embodiments, the number of contact elements 414 may be increased and their respective diameters decreased to minimize the contact area with the backside of the substrate 108. Similarly, a thickness of the edge seal band 416 and the plurality of lift pin seal bands 418 may also be decreased to minimize the contact area with the backside of the substrate 108.

Figure 5:
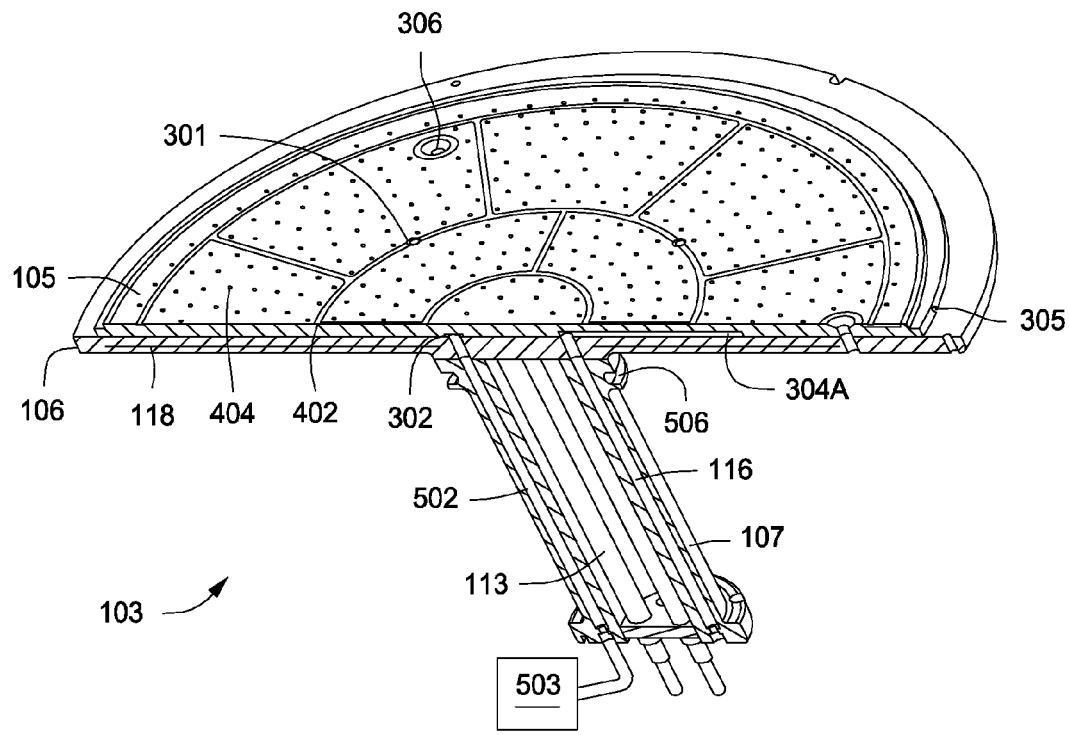
FIG. 5 depicts a isometric, cross-sectional view of a substrate support in accordance with some embodiments of the present disclosure.

FIG. 5 depicts a cross-sectional isometric view of the substrate support 103 in accordance with some embodiments of the present disclosure. As seen in FIG. 5, a conduit 502 is coupled to a vacuum chucking supply 503 at one end and opens into the vacuum grooves 302 at an opposite end. The vacuum grooves 302 communicate with a plurality of vacuum channels 402 on the top of the first plate 105 via the openings 301 to chuck a substrate 108 placed on the first plate 105. In some embodiments, the first plate 105 may include the plurality of contact elements 414 (e.g., sapphire balls) to prevent particle generation on the backside of the substrate 108 when placed on the first plate 105. In some embodiments, the substrate support 103 may include a slot 506 formed in the support shaft 107 to receive the reflective heat shield 140.

Figure 6:
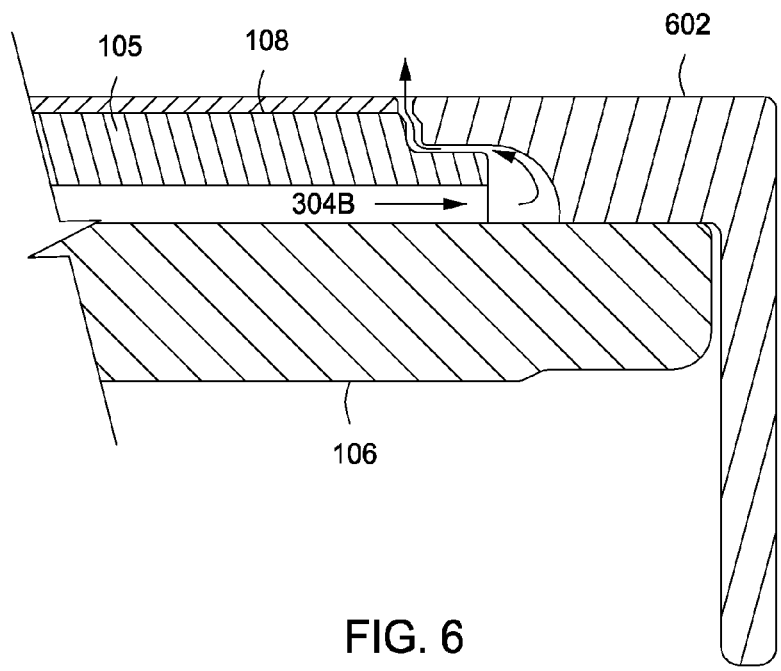
FIG. 6 depicts a cross-sectional side view of a portion of a substrate support in accordance with some embodiments of the present disclosure.

FIG. 6 depicts a side cross-sectional view of the periphery of the first and second plates 105, 106. In some embodiments, the substrate support 103 may include an edge ring 602 disposed above the second plate 106 and surrounding the first plate 105. The edge ring 602 is spaced apart from the first plate 105 to allow purge gases flowing out of the outlets 305 to flow between the first plate 105 and the edge ring 602 as indicated by the arrows in FIG. 6. In some embodiments, the periphery of the first plate 105 is shaped to correspond with an inner portion of the edge ring 602. In some embodiments, the edge ring 602 and the periphery of the first plate 105 define a choked flow path between the edge ring 602 and the first plate 105. As a result, a more uniform flow of purge gas surrounding the substrate 108 is achieved.

Thus, embodiments of substrate supports that may provide improved heating uniformity have been provided herein. The inventive substrate support may improve the uniformity of heating of a substrate being processed, thus improving deposition uniformity.

While the foregoing is directed to embodiments of the present disclosure, other and further embodiments of the disclosure may be devised without departing from the basic scope thereof.

The invention claimed is:

1. A substrate support, comprising:
   a body having a support surface;
   a first heater disposed within the body and having a first heating coil and multiple heating zones, wherein a pitch of windings of the first heating coil varies among each of the multiple heating zones to define a predetermined heating ratio between the multiple heating zones;
   a plurality of vacuum channels disposed in the body and comprising a first circular vacuum channel, a second circular vacuum channel, and a third circular vacuum channel, wherein the first, second, and third circular vacuum channels are concentric;
   a first plurality of radial channels extending between the first circular vacuum channel and the second circular vacuum channel, wherein the first plurality of radial channels intersects the second circular vacuum channel at a first plurality of intersection points;
   a second plurality of radial channels extending between the second circular vacuum channel and the third circular vacuum channel, wherein the second plurality of radial channels intersects the second circular vacuum channel at a second plurality of intersection points different than the first plurality of intersection points; and
   a plurality of openings disposed in the second circular vacuum channel to fluidly couple a vacuum chucking supply to the plurality of vacuum channels.

2. The substrate support of claim 1, further comprising:
   a second heater having a second heating coil, wherein the second heater is disposed outside of a diameter of a substrate to be processed.

3. The substrate support of claim 2, wherein first heater is disposed radially inward of the second heater.

4. The substrate support of claim 2, wherein the first heater and the second heater are independently controllable.

5. The substrate support of claim 1, wherein the multiple heating zones includes a first heating zone, a second heating zone, and a third heating zone.

6. The substrate support of claim 5, wherein the predetermined heating ratio of the first heating zone, the second heating zone, and the third heating zone is 1:0.4:0.3.

7. The substrate support of claim 5, wherein a first pitch of windings within the first heating zone is greater than a second pitch of windings within the second heating zone, and wherein the second pitch of windings within the second heating zone is greater than a third pitch of windings within the third heating zone.

8. The substrate support of claim 1, further comprising:
   a support shaft to support the body; and
   a reflective heat shield coupled to the shaft and disposed below the body to reflect heat emitted from a bottom of the body back toward the body.

9. A process chamber, comprising:
   a chamber body defining an inner volume;
   a substrate support disposed in the inner volume, comprising:
      a body having a support surface;
      a first heater disposed within the body and having a first heating coil and multiple heating zones, wherein a pitch of windings of the first heating coil varies among each of the multiple heating zones to define a predetermined heating ratio between the multiple heating zones;
      a plurality of vacuum channels disposed in the support surface and comprising a first circular vacuum channel, a second circular vacuum channel, and a third circular vacuum channel, wherein the first, second, and third circular vacuum channels are concentric;
      a first plurality of radial channels extending between the first circular vacuum channel and the second circular vacuum channel, wherein the first plurality of radial channels intersects the second circular vacuum channel at a first plurality of intersection points;
      a second plurality of radial channels extending between the second circular vacuum channel and the third circular vacuum channel, wherein the second plurality of radial channels intersects the second circular vacuum channel at a second plurality of intersection points different than the first plurality of intersection points; and
      a plurality of openings disposed in the second circular vacuum channel to fluidly couple a vacuum chucking supply to the plurality of vacuum channels.

10. The process chamber of claim 9, wherein the substrate support further comprises:
    a second heater having a second heating coil, wherein the second heater is disposed outside of a diameter of a substrate to be processed.

11. The process chamber of claim 10, wherein first heater is disposed radially inward of the second heater.

12. The process chamber of claim 10, wherein the first heater and the second heater are independently controllable.

13. The process chamber of claim 9, wherein the multiple heating zones includes a first heating zone, a second heating zone, and a third heating zone.

14. The process chamber of claim 13, wherein the predetermined heating ratio of the first heating zone, the second heating zone, and the third heating zone is 1:0.4:0.3.

15. The process chamber of claim 13, wherein a first pitch of windings within the first heating zone is greater than a second pitch of windings within the second heating zone, and wherein the second pitch of windings within the second heating zone is greater than a third pitch of windings within the third heating zone.

16. The process chamber of claim 9, wherein the substrate support further comprises:
    a support shaft to support the body; and
    a reflective heat shield coupled to the shaft and disposed below the body to reflect heat emitted from a bottom of the body back toward the body.

* * * * *